(12) United States Patent
Hayashi

(10) Patent No.: US 8,785,107 B2
(45) Date of Patent: Jul. 22, 2014

(54) LITHOGRAPHIC PRINTING PLATE PRECURSOR

(75) Inventor: Koji Hayashi, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/825,136

(22) PCT Filed: Aug. 19, 2011

(86) PCT No.: PCT/JP2011/069238
§ 371 (c)(1),
(2), (4) Date: Mar. 20, 2013

(87) PCT Pub. No.: WO2012/039233
PCT Pub. Date: Mar. 29, 2012

(65) Prior Publication Data
US 2013/0196268 A1    Aug. 1, 2013

(30) Foreign Application Priority Data
Sep. 22, 2010 (JP) ................................. 2010-211946

(51) Int. Cl.
*B41M 5/00* (2006.01)
*B41N 1/00* (2006.01)
*G03F 7/00* (2006.01)
*G03F 7/26* (2006.01)

(52) U.S. Cl.
USPC .................... 430/270.1; 430/281.1; 430/302; 101/453; 101/463.1

(58) Field of Classification Search
USPC ................................................ 430/270.1, 302
See application file for complete search history.

(56) References Cited

U.S. PATENT DOCUMENTS

2010/0236436 A1 *    9/2010   Miyamoto et al. ............ 101/458

FOREIGN PATENT DOCUMENTS

WO    WO 2009050947 A1 *    4/2009
WO    WO 2009054904 A1 *    4/2009    ............... B41C 1/10

* cited by examiner

*Primary Examiner* — Chanceity Robinson
(74) *Attorney, Agent, or Firm* — J. Lanny Tucker

(57) ABSTRACT

A lithographic printing plate precursor is provided that exhibits less blooming without using a specific polymerization initiator, infrared radiation absorbing agent and the like. The lithographic printing plate precursor comprises a substrate having thereon an image forming layer comprising a radiation-sensitive composition which comprises a radical polymerizable component, an infrared radiation absorbing agent and a radical polymerization initiator, wherein the radiation-sensitive composition comprises a fluorinated copolymer substantially having no hydrophilic moiety.

12 Claims, No Drawings

LITHOGRAPHIC PRINTING PLATE PRECURSOR

TECHNICAL FIELD

The present invention relates to a lithographic printing plate precursor comprising a negative-working radiation-sensitive composition, and particularly to a negative-working lithographic printing plate precursor having satisfactory shelf life.

BACKGROUND ART

A negative-working radiation-sensitive composition is particularly used in a lithographic printing plate precursor, and such a composition generally comprises a radiation-sensitive component, a radical polymerizable component and an initiator system. The development in the field of a lithographic printing plate precursor has recently been directed to a radiation-sensitive composition which enables formation of images by a laser or laser diode, and more specifically enables formation of images and/or development on press. Since the laser can be directly controlled by a computer, laser exposure does not require a silver halide film, like a "mask" with images formed thereon. It is necessary that a high-performance laser or laser diode to be used in a commercially available image setter generally emits radiation having a wavelength of at least 700 nm and also a radiation-sensitive composition is sensitized in a near infrared or infrared range of an electromagnetic spectrum. However, other useful radiation-sensitive compositions are configured to form images under ultraviolet or visible radiation.

A lithographic printing plate precursor includes two types, for example, negative-working and positive-working lithographic printing plate precursors. In the case of a negative-working printing plate precursor, the exposed area in a radiation-sensitive composition is cured and the non-exposed area is removed by dissolving in a developing solution. In contrast, in the case of a positive-working printing plate precursor, the exposed area becomes soluble in a developing solution and removed by dissolving therein, and the non-exposed area remains on a substrate.

Various negative-working radiation-sensitive compositions comprising a reactive polymer binder and lithographic printing plate precursors are known to a person with an ordinary skill in the art. These radiation-sensitive compositions generally contain a radiation-sensitive component, a radical polymerizable component and an initiator system, and also contain various additional components for improving developing properties, photosensitivity and the like.

Various radiation-sensitive compositions in this technical field contain a lot of salts as components thereof. For example, various ionic compounds are used as an IR dye of an infrared radiation absorbing agent, and also various ionic compounds are used as a polymerization initiator. These ionic compounds tend to move and gather in a coating film of a radiation-sensitive composition during storage, and thus leading to localization and further crystallization (such a state is referred to as "blooming"). When a lithographic printing plate precursor, which caused blooming, is exposed so as to form images, the moiety where blooming occurs, undergoes insufficient curing to cause curing unevenness, or even worse, the moiety may sometimes fail to cure. Such a case has been at issue, heretofore.

Patent Literature 1: Japanese Unexamined Patent Publication (Kokai) No. 2009-538446. This publication proposes, as one of methods of preventing blooming of a lithographic printing plate precursor, use of an iodonium borate initiator composition having a specific structure, which does not cause blooming in a coating film of a radiation-sensitive composition. However, it is preferred that blooming can be prevented without using a specific polymerization initiator, infrared radiation absorbing agent and the like.

Blooming decreases shelf life of a lithographic printing plate precursor and makes formation of images unstable. Accordingly, there exits a need for a lithographic printing plate precursor having improved shelf life, which does not cause blooming.

SUMMARY OF THE INVENTION

The inventors of the present application have found that blooming is accelerated by moisture in a coating film of a radiation-sensitive composition. A lithographic printing plate precursor is dried and packed after preparation. When the lithographic printing plate precursor is stored for a long period, moisture in a package penetrates from a surface of a coating film. In the case of being left to stand after unpacking, moisture contained in ambient air penetrates from a surface of a coating film. Water molecules have polarity, and it is considered that polarity accelerates localization of an ionic compound.

The inventors of the present application have found that movement and localization of an ionic compound are suppressed by adding a fluorinated polymer having no hydrophilic moiety to a radiation-sensitive composition, and thus completing the present invention. The present invention provides a lithographic printing plate precursor including a substrate having thereon an image forming layer comprising a radiation-sensitive composition which comprises a radical polymerizable component, an infrared radiation absorbing agent and a radical polymerization initiator, wherein the radiation-sensitive composition comprises a fluorinated polymer substantially having no hydrophilic moiety.

DESCRIPTION OF EMBODIMENTS

In a lithographic printing plate precursor of the present invention, a fluorinated polymer substantially having no hydrophilic moiety is used as an additive of a radiation-sensitive composition. Herein, "substantially having no hydrophilic moiety" means that this fluorinated polymer does not exert a function as a surfactant since it substantially having no hydrophilicity. The surfactant has a hydrophilic group and a hydrophobic group in the structure and the hydrophilic group is likely to bond with water molecules, and it is considered that when the hydrophilic group exists, water molecules become easy to be incorporated into a coating film, and thus promoting blooming.

The "hydrophilic moiety" used in the description refers to a moiety which strongly interacts with water in the structure of a compound, and typically refers to a cationic group, an anionic group, an acidic group, a polyoxyethylene group and the like. Specifically, —COOH, —OH, —NH$_2$, —NHCONH$_2$, —(OCH$_2$CH$_2$)—, —SO$_3$H, —SO$_3$M, —OSO$_3$H, —OSO$_3$M, —COOM, NR$_3$X (wherein M is an alkali metal or —NH$_4$, R is an alkyl group, and X is a halogen) and the like are exemplified. A fluorinated polymer, which can be used in the lithographic printing plate precursor of the present invention, substantially has no hydrophilic moiety.

One example of a fluorinated polymer, which can be used in a lithographic printing plate precursor of the present invention, is a fluorinated polymer represented by the formula (A) shown below:

Formula (A):

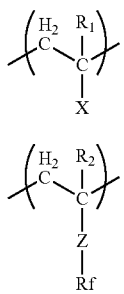

wherein $R_1$ and $R_2$ are hydrogens or methyl groups,

Rf represents an aliphatic group substituted with a fluorine atom,

Z represents a divalent organic group, and

X represents an optional organic group which does not substantially contain a cationic group, an anionic group, an acidic group and a polyoxyethylene group.

The fluorinated polymer of the formula (A) preferably comprises 10 to 97 mol % of a monomer unit of the formula (I) and 3 to 90 mol % of a monomer unit of the formula (II).

An Rf group of the formula (A) is preferably an aliphatic group having 1 to 20 carbon atoms in which at least two hydrogen atoms of the terminal carbon are substituted with a fluorine atom.

The Rf group is an aliphatic group which is usually saturated, and is also generally monovalent or divalent. This aliphatic group has a linear, branched or cyclic structure, or a combination thereof (for example, alkylcycloaliphatic group). A fluoroaliphatic structure chain can contain connected oxygen and/or trivalent nitrogen heteroatoms bonded only to the carbon atom. This heteroatom gives a stable bond between fluorocarbon groups, and also does not disturb inertness properties of the Rf group.

The Rf group has 1 to 20, and preferably 4 to 10 carbon atoms, and at least two hydrogen atoms among three terminal hydrogen atoms are substituted with a fluorine atom. The terminal end of the Rf group includes, for example, $CF_3CF_2CF_2$—. In particular, the Rf group is suitably a perfluoroalkyl group. The perfluoroalkyl group is an alkyl group, which is substantially completely or sufficiently fluorinated, like $C_nF_{2n+1}$ (n is an integer of 3 or more).

An Rf group having 1 to 20 carbon atoms has large effect of preventing localization of an ionic compound and, in particular, a Rf group having 4 to 10 carbon atoms has larger effect of preventing localization of an ionic compound. In contrast, in the case of an Rf group having 21 or more carbon atoms, the solubility of the obtained copolymer in a solvent decreases, and thus generating a restriction on the solvent when used in a lithographic printing plate precursor.

Z of the formula (A) represents a divalent organic group and is, for example, a —CO—O— group, a —CO—NH— group, a CO—O-Q- group, a —CO—NH-Q- group or the like. Herein, a Q group represents a methylene group, an ethylene group, a —$CH_2$—$CH_2$—CO—O— group or a —$CH_2$—$CH_2$—O—CO— group.

X of the formula (A) is an optional organic group which does not contain a cationic group, an anionic group, an acidic group and a polyoxyethylene group. Examples of the cationic group, anionic group, acidic group and polyoxyethylene group, which are not included in X, are as follows. Examples of the cationic group include a trialkylammonium group, an ammonium group and the like; examples of the anionic group include a carboxylate group, a sulfonate group, a phosphonate group and the like; and examples of the acidic group include a carboxyl group, a sulfonic acid group, a phosphonic acid group, a sulfate ester group, a phosphate ester group and the like. All of these groups are groups which impart hydrophilicity, and a fluorinated polymer having such a group is not substantially used in the present invention.

X is preferably a —CO-A-Y group. A represents an oxygen atom or $NR^4$—, in which $R^4$ represents a hydrogen atom or a monovalent hydrocarbon group having 1 to 10 carbon atoms. Y is selected from the group consisting of an alkyl group which may have a substituent, an aryl group which may have a substituent and a monovalent organic group having an unsaturated group.

Examples of the monomer comprising X of a fluorinated polymer of the present invention include acrylate esters such as alkyl acrylate (the alkyl group preferably has 1 to 20 carbon atoms), specifically, for example, methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, etc.; methacrylate esters such as aryl acrylate (for example, phenyl acrylate, etc.) and alkyl methacrylate (the alkyl group preferably has 1 to 20 carbon atoms), specifically, for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.); aryl methacrylate (for example, phenyl methacrylate, cresyl methacrylate, naphthyl methacrylate, etc.); styrenes such as styrene and alkylstyrene (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.); alkoxystyrene (for example, methoxystyrene, 4-methoxy-3-methylstyrene, dimethoxystyrene, etc.), halogenstyrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), acrylonitrile, methacrylonitrile and the like.

Examples of the monomer also include monomers having structures shown below:

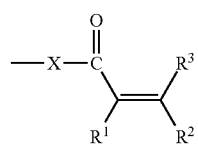

(1)

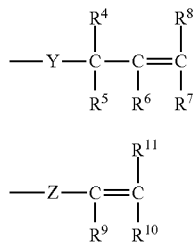

wherein X and Y each independently represents an oxygen atom, a sulfur atom or —N(R$^{12}$)—, Z represents an oxygen atom, a sulfur atom, —N(R$^{12}$)— or a phenylene group, and R$^1$ to R$^{12}$ each independently represents a monovalent substituent.

In the general formula (1), R$^1$ to R$^3$ each independently represents a monovalent substituent and R$^1$ includes, for example, a hydrogen atom, a monovalent organic group, an alkyl group which may have a substituent and the like and, among these groups, a hydrogen atom, a methyl group, a methylalkoxy group and a methylester group are preferred. R$^2$ and R$^3$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent. Among these groups, a hydrogen atom, a carboxyl group, an alkoxycarbonyl group, an alkyl group which may have a substituent and an aryl group which may have a substituent are preferred. Herein, an introducible substituent includes a methoxycarbonyl group, an ethoxycarbonyl group, an isopropoxycarbonyl group, a methyl group, an ethyl group, a phenyl group and the like. X represents an oxygen atom, a sulfur atom or an —N(R$^{12}$)—, and R$^{12}$ includes an alkyl group which may have a substituent.

In the general formula (2), R$^4$ to R$^8$ each independently represents a monovalent substituent and include, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent and the like. Among these groups, a hydrogen atom, a carboxyl group, an alkoxycarbonyl group, an alkyl group which may have a substituent and an aryl group which may have a substituent are preferred. Examples of the introducible substituent include those exemplified in the general formula (1). Y represents an oxygen atom, a sulfur atom or —N(R$^{12}$)—. R$^{12}$ includes those exemplified in the general formula (1).

In the general formula (3), R$^9$ to R$^{11}$ each independently represents monovalent substituent and include, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent and the like. Among these groups, a hydrogen atom, a carboxyl group, an alkoxycarbonyl group, an alkyl group which may have a substituent and an aryl group which may have a substituent are preferred. Herein, examples of the introducible substituent include those exemplified in the general formula (1). Z represents an oxygen atom, a sulfur atom, —N(R$^{12}$)— or a phenylene group. R$^{12}$ includes those exemplified in the general formula (1).

Among these groups, a methacryloyloxy group represented by the general formula (1) is preferred.

It is preferred that a monomer unit of the formula (I) exists in a fluorinated polymer in the amount of 10 to 97 mol %. It is not preferred that the amount is less than 10 mol % since the solubility in the coating solvent decreases. It is not preferred that the amount is more than 97 mol % since hydrophobicity of the fluorinated polymer deteriorates, and thus resulting in deterioration of the effect of the present case. The amount of a monomer unit of the formula (I) is more preferably from 50% to 97%.

It is preferred that a monomer unit of the formula (II) exists in a fluorinated polymer in the amount of 3 to 90 mol %. It is not preferred that the amount is less than 3 mol % since the hydrophobicity of the fluorinated polymer deteriorates, and thus resulting in deterioration of the effect of the present case. It is not preferred that the amount is more than 90 mol % since the solubility in the coating solvent decreases. The amount of a monomer unit of the formula (II) is more preferably from 3% to 50%.

The fluorinated polymer of the present invention can serve as a block copolymer or a random copolymer.

It is preferred that the fluorinated polymer of the present invention further optionally comprises a monomer unit having a maleimide structure represented by the formula (1) shown below:

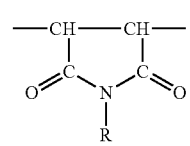

wherein R is a hydrogen atom, or a hydrocarbon group selected from the group consisting of an alkyl group which may have a substituent, an alkenyl group and an aryl group.

The fluorine-containing resin having a maleimide structure is further excellent in the improving effect of the present case by increasing the hydrophobicity of a fluorinated polymer. The maleimide structure is more preferably an N-substituted maleimide structure, and still more preferably an N-cyclic hydrocarbon-substituted maleimide structure.

Examples of the method of incorporating a maleimide structure into the structure of a fluorine-containing resin include a method of adding an amine compound to a maleic anhydride-containing polymer (imidation), a method of polymerizing (meth)acrylate having an Rf group, (meth)acrylate having a hydroxyl group, or (meth)acrylic acid, or (meth)acrylate having a glycidyl group, and a compound having a maleimide structure. These methods are disclosed, for example, in Japanese Unexamined Patent Publication (Kokai) No. 59-24844, Japanese Unexamined Patent Publication (Kokai) No. 61-34046, Japanese Unexamined Patent Publication (Kokai) No. 61-128243, Japanese Unexamined Patent Publication (Kokai) No. 61-162039, Japanese Unexamined Patent Publication (Kokai) No. 61-250048, Japanese Unexamined Patent Publication (Kokai) No. 62-94840, Japanese Unexamined Patent Publication (Kokai) No. 62-153305, Japanese Unexamined Patent Publication (Kokai) No. 62-283108 and the like. Typical examples of the maleic anhydride-containing polymer include a styrene-maleic anhydride copolymer.

Examples of the compound having a maleimide structure include N-substituted maleimides such as N-phenylmaleimide, N-phenylmethylmaleimide, N-chlorophenylmaleimide, N-methoxyphenylmaleimide, N-methylphenylmaleimide, N-dimetlylphenylmaleimide, N-ethylphenylmaleimide, N-diethylphenylmaleimide, N-nitrophenylmaleimide, N-phenoxyphenylmaleimide, N-hydroxyphenylmaleimide, N-carboxyphenylmaleimide, N-phenylcarbonylphenylmaleimide, N-methylmaleimide, N-ethylmaleimide, N-vinylmaleimide, N-allylmaleimide, N-cyclohexylmaleimide and N-laurylmaleimide; and N-unsubstituted maleimides such as maleimide. In the substituted phenyl group bonded to the above maleimides, the substituent may be bonded to any other carbon atoms which are not bonded to the N atom in a phenyl group.

Specific examples of the fluorinated polymer having no hydrophilic moiety, which can be used in the lithographic printing plate precursor of the present invention, include fluorinated polymers shown below. The proportion in the formula represents mol %.

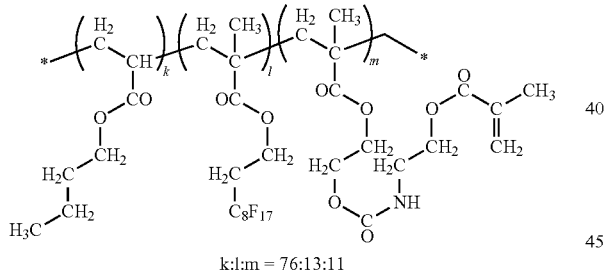

k:l:m = 76:13:11

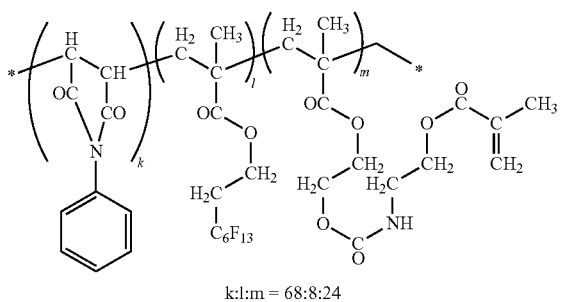

k:l:m = 68:8:24

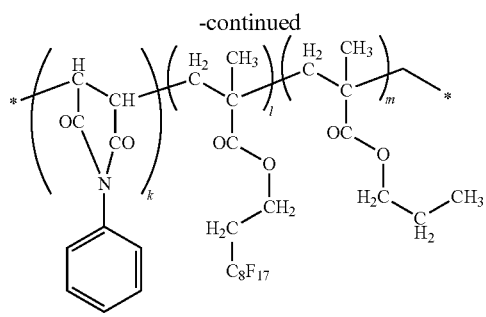

k:l:m = 54:5:41

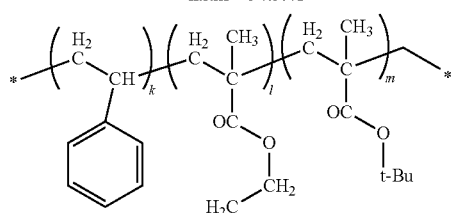

k:l:m = 68:4:28

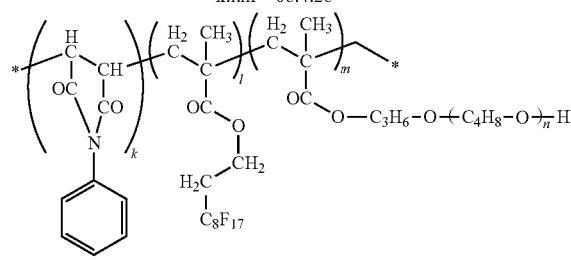

k:l:m = 83:10:7, n = 6

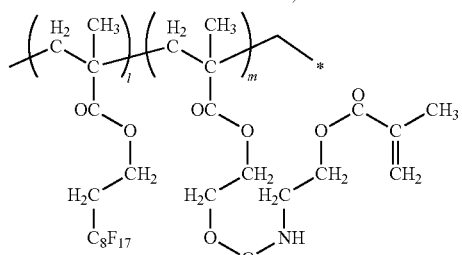

l:m = 56:44

These compounds have no surfactant action. These fluorinated polymers may be used alone, or may be used as a mixture of a plurality of compounds.

The total amount of the fluorinated polymer having no hydrophilic moiety is at least 0.01% by mass based on the dry weight of the image forming layer, and the fluorinated polymer having no hydrophilic moiety exists in the image forming layer in the amount of at most 10% by mass based on the dry weight of the image forming layer. Preferably, the fluorinated polymer having no hydrophilic moiety exists in the amount of 0.1 to 1% by mass based on the dry weight of the image forming layer. It is not preferred that the amount of the fluorinated polymer is less than 0.01% by mass since the effect of the present case deteriorates. It is not preferred that the amount of the fluorinated polymer is more than 10% by mass since image intensity during exposure deteriorates.

<Radical Polymerizable Component>

The radiation-sensitive composition of the present invention comprises, as a polymerizable compound, a neutralized phosphate ester compound having a (meth)acryloyl group. An image forming layer comprising the neutralized phosphate ester compound having a (meth)acryloyl group to be used in the present invention is cured as a result of addition polymerization due to an action of a photopolymerization initiator when irradiated with activation radiation. The imagewise-exposed lithographic printing plate precursor is treated with an appropriate developing solution, whereby, the non-exposed area is removed to form negative images.

The phosphate ester compound having a (meth)acryloyl group, which can be use in the present invention, is a phosphate ester having at least one (meth)acryloyl group in the structural formula, and is specifically a phosphoric acid (meth)acrylate monomer having the structure of the formula shown below:

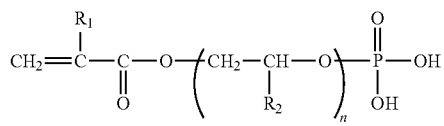

wherein $R_1$ is a hydrogen atom or a methyl group, $R_2$ is a hydrogen atom or a methyl group, and n is an integer of 1 to 6.

In the case of having a phosphoric acid methacrylate structure, existence of polyalkylene glycol chains such as a PEG (polyethylene glycol) chain and a PPG (polypropylene glycol) chain in a molecular structure is preferred for the purpose of improving satisfactory developing properties on a printing press. The compound contained in the above structural formula includes, for example, compounds shown below. All of these compounds are commercially available from Unichemical Co., Ltd.

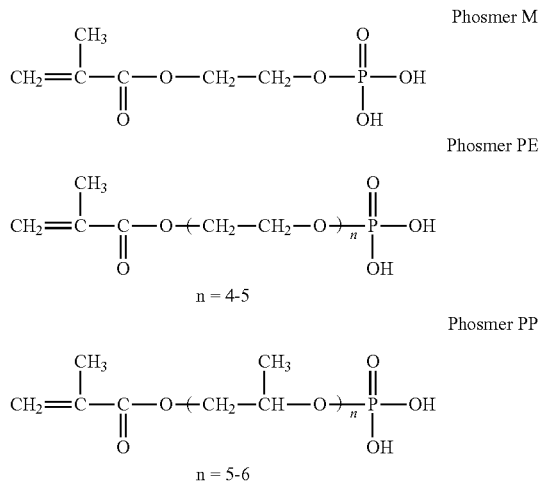

In the present invention, these phosphoric acid (meth)acrylate monomers are neutralized with a base. Neutralization is carried out by a method of adding a base in the amount of 1 to 2 equivalents on a molar basis to a phosphoric acid (meth)acrylate monomer. Examples of the base, which can be used in neutralization, include an alkali metal hydroxide, an alkali earth metal hydroxide, an organic amine and the like. Among these bases, an alkali metal hydroxide and a hydroxyl alkylamine are preferred. For example, lithium hydroxide, sodium hydroxide and potassium hydroxide are included in the alkali metal hydroxide. For example, methylhydroxylamine, ethylhydroxylamine and triethanolaminehydroxyl are included in the alkylamine.

The proportion of the phosphoric acid (meth)acrylate monomer to be neutralized is from 5 to 20% by mass based on the entire solid component which constitutes a layer made of a photosensitive composition. When the proportion is less than 5% by mass, adhesion to a substrate is poor and also ink stains are generated on the non-image area due to time-dependent change. When the proportion of the phosphoric acid (meth)acrylate monomer to be neutralized is more than 20% by mass, mechanical strength of the image formation range decreases.

It is desired to contain, as a polymerizable compound, a polymerizable compound other than the phosphoric acid (meth)acrylate monomer, together, in the photosensitive composition of the present invention. For example, it is possible to use in the form of a monomer, an oligomer, a polymer, or a mixture thereof.

Examples of the monomer or oligomer include an unsaturated carboxylic acid (for example, acrylic acid, methacrylic acid, itaconic acid, crotonic acid, isocrotonic acid, maleic acid) and esters and amides thereof, and an ester of an unsaturated carboxylic acid and an aliphatic polyhydric alcohol compound, and amides of an unsaturated carboxylic acid and an aliphatic polyhydric amine compound are preferably use.

It is also possible to suitably use an unsaturated carboxylate ester having a nucleophilic substituent such as a hydroxyl group, an amino group or a mercapto group; an addition reaction product of amides and monofunctional or polyfunctional isocyanates or epoxys; a dehydration-condensation reaction product of amides and a monofunctional or polyfunctional carboxylic acid.

It is also suitable to use an addition reaction product of an unsaturated carboxylate ester or amides having an electrophilic substituent such as an isocyanate group or an epoxy group, and monofunctional or polyfunctional alcohols, amines and thiols; and a substituted reaction product of unsaturated carboxylate ester or amides having a leaving substituent such as a halogen group or a tosyloxy group, and monofunctional or polyfunctional alcohols, amines and thiols. It is also possible to use the group of compounds in which the above unsaturated carboxylic acid has been replaced by an unsaturated phosphoric acid, styrene and the like.

Specific examples of the radical polymerizable compound, which is an ester of an aliphatic polyhydric alcohol compound and an unsaturated carboxylic acid, include acrylate esters such as ethylene glycol diacrylate, triethylene glycol diacrylate, polyethylene glycol methyl ether acrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer.

Examples of the methacrylate ester include tetramethylene glycol dimethacrylate, triethylene glycol dimethacrylate, polyethylene glycol methyl ether methacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol pentamethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane and the like.

Examples of the itaconate ester include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate and the like.

Examples of the crotonate ester include ethylene glycol dicrotonate, tetramethylene glycol dicrotonate, pentaerythritol dicrotonate, sorbitol tetradicrotonate and the like.

Examples of the isocrotonate ester include ethylene glycol diisocrotonate, pentaerythritol diisocrotonate, sorbitol tetraisocrotonate and the like.

Examples of the maleate ester include ethylene glycol dimaleate, triethylene glycol dimaleate, pentaerythritol dimaleate, sorbitol tetramaleate and the like.

Examples of the other ester include aliphatic alcohol-based esters disclosed in Japanese Examined Patent Publication (Kokoku) No. 46-27926, Japanese Examined Patent Publication (Kokoku) No. 51-47334 and Japanese Unexamined Patent Publication (Kokai) No. 57-196231; those having an aromatic structure disclosed in Japanese Unexamined Patent Publication (Kokai) No. 59-5240, Japanese Unexamined Patent Publication (Kokai) No. 59-5241 and Japanese Unexamined Patent Publication (Kokai) No. 2-226149; those having an amino group disclosed in Japanese Unexamined Patent Publication (Kokai) No. 1-165613 and the like.

Specific examples of the radical polymerizable compound, which is an amide of an aliphatic polyhydric amine compound and an unsaturated carboxylic acid, include methylenebis-acrylamide, methylenebis-methacrylamide, 1,6-hexamethylenebis-acrylamide, 1,6-hexamethylenebismethacrylamide, diethylenetriaminetrisacrylamide, xylylenebisacrylamide, xylylenebismethacrylamide and the like. Examples of the other preferred amide-based monomer include those having a cyclohexylene structure disclosed in Japanese Examined Patent Publication (Kokoku) No. 54-21726.

An urethane-based addition polymerizable compound produced by the addition reaction between isocyanate and a hydroxyl group is also suitable, and specific examples thereof include a vinylurethane compound having two or more polymerizable vinyl groups in a molecule obtained by adding a vinyl monomer having a hydroxyl group, which is represented by $CH_2=C(R^1)COOCH_2CH(R^2)OH$ (wherein $R^1$ and $R^2$ each independently represents H or $CH_3$), to a polyisocyanate compound having two or more isocyanate groups in a molecule, which is disclosed in Japanese Examined Patent Publication (Kokoku) No. 48-41708.

It is also suitable to use urethane acrylates disclosed in Japanese Unexamined Patent Publication (Kokai) No. 51-37193, Japanese Examined Patent Publication (Kokoku) No. 2-32293 and Japanese Examined Patent Publication (Kokoku) No. 2-16765; and urethane compounds having an ethylene oxide-based structure disclosed in Japanese Examined Patent Publication (Kokoku) No. 58-49860, Japanese Examined Patent Publication (Kokoku) No. 56-17654, Japanese Examined Patent Publication (Kokoku) No. 62-39417 and Japanese Examined Patent Publication (Kokoku) No. 62-39418.

It is also possible to use radical polymerizable compounds having the amino structure or sulfide structure in the molecule disclosed in Japanese Unexamined Patent Publication (Kokai) No. 63-277653, Japanese Unexamined Patent Publication (Kokai) No. 63-260909 and Japanese Unexamined Patent Publication (Kokai) No. 1-105238. It is also possible to exemplify specific unsaturated compounds disclosed in Japanese Examined Patent Publication (Kokoku) No. 46-43946, Japanese Examined Patent Publication (Kokoku) No. 1-40337 and Japanese Examined Patent Publication (Kokoku) No. 1-40336; and a vinylphosphonic acid-based compound disclosed in Japanese Unexamined Patent Publication (Kokai) No. 2-25493. In some cases, the structure having a perfluoroalkyl group disclosed in Japanese Unexamined Patent Publication (Kokai) No. 61-22048 is suitably used. It is also possible to use those which are introduced as a photocurable monomer and oligomer in Journal of the Adhesion Society of Japan, Vol. 20, No. 7, pp. 300-308 (1984).

Examples of the polymer type radical polymerizable compound having at least one ethylenically unsaturated double bond include, in addition to a polymer of the above monomer or oligomer, polyester acrylates disclosed in the respective publications such as Japanese Unexamined Patent Publication (Kokai) No. 48-64183, Japanese Examined Patent Publication (Kokoku) No. 49-43191 and Japanese Examined Patent Publication (Kokoku) No. 52-30490; and polyfunctional acrylate and methacrylate, such as epoxy acrylates obtained by reacting an epoxy resin with (meth)acrylic acid.

The polymerizable compound of the present invention exists in a photosensitive composition in sufficient amount such that the photosensitive composition becomes insoluble in a wet developing agent, or a fountain solution/printing ink after exposure to radiations such as ultraviolet radiation (UV), visible radiation and infrared radiation (IR). Specifically, the amount of polymerizable compound is preferably within a range from 5 to 80% by mass, and more preferably from 10 to 70% by mass, based on all components of the photosensitive composition.

<Infrared Radiation Absorbing Agent>

Preferred infrared radiation absorbing agent, which can be used in the lithographic printing plate precursor of the present invention, includes a squarylium dye, a croconate dye, a triarylamine dye, a thiazolium dye, an indolium dye, an oxazolium dye, a cyanine and a merocyanine dye, a polyaniline dye, a polypyrrole dye, a polythiophene dye, a chalcogenopyrylo-arylidene and a bis(chalcogenopyrylo)polymethine dye, an oxyindolizine dye, a pyrylium dye, and a phthalocyanine dye. Other useful infrared radiation absorbing agents include azulenium and xanthene dyes, and carbon black, metal carbides, borides, nitrides, carbonitrides and oxides with the bronze structure.

Among these infrared radiation absorbing agents, a near infrared radiation absorbing cationic dye represented the formula shown below since it enables a photopolymerization initiator to efficiently exert a polymerization function:

wherein $D^+$ represents a cationic dye absorbing in a near infrared range, and $A^-$ represents an anion, and $A^-$ may have the structure of an inner salt in the dye molecule.

Examples of the cationic dye absorbing in a near infrared range include a cyanine-based dye, a triarylmethane-based dye, an aminium-based dye and a diimmonium-based dye, each absorbing in a near infrared range. Specific examples of cationic dye absorbing in a near infrared range include those shown below.

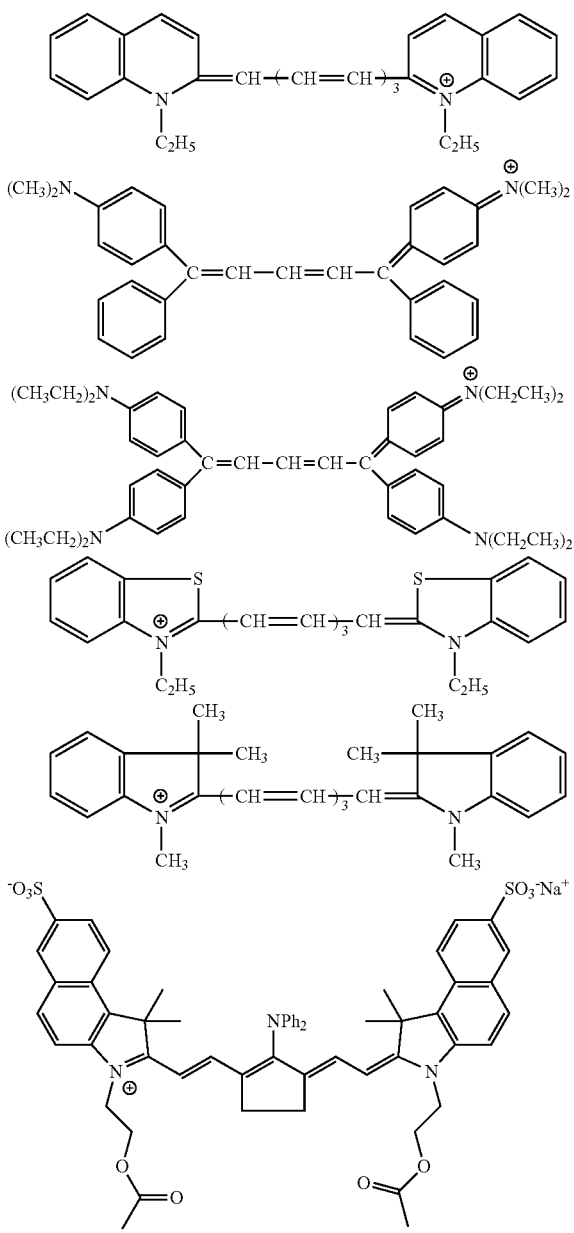

Examples of the anion include a halogen anion, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and the quaternary boron anion, a boron anion represented by the above formula (1) and the like. The boron anion is preferably a triphenyl n-butylboron anion and a tfinaphthyl n-butylboron anion.

When a dye is used as the infrared radiation absorbing agent, the content of the dye is preferably within a range from 0.5 to 15% by mass, and particularly preferably from 1 to 10% by mass, based on the entire solid content of the photosensitive composition. It is not preferred that the content of the dye is less than 0.5% by mass because of insufficient absorption of infrared radiation, and that the content of the dye is more than 15% by mass since absorption of infrared radiation substantially reaches saturation and thus the addition effect tends to fail to increase.

<Radical Polymerization Initiator>

It is preferred that the photosensitive composition of the present invention comprises the above-mentioned polymerizable compound, and a photopolymerization initiator for generating an initiation free radical. It is possible to use, as the photopolymerization initiator, any photopolymerization initiator as long as it enables initiation of polymerization of the above-mentioned polymerizable compound. It is possible to use a photoinitiator which is active to ultraviolet radiation corresponding to a spectrum within a range from about 300 nm to 1,400 nm, visible radiation, and/or electromagnetic radiation within a spectrum within a range of infrared radiation. Such a photoinitiator system comprises, for example, trichloromethyltriazine existing alone or together with a photosensitizer, which is disclosed in the specification of U.S. Pat. No. 4,997,745; a diaryliodonium salt and a photosensitizer, which is disclosed in the specification of U.S. Pat. No. 5,546,258; a photosensitizer for visualization of visible radiation, existing together with trichloromethyltriazine, which is disclosed in the specification of U.S. Pat. No. 5,599,650; 3-ketocoumarin for UV radiation and visualization of visible radiation, existing together with a polycarboxylic acid co-initiator such as anilino-N,N-diacetic acid, a diaryliodonium salt, titanocene, haloalkyltriazine, hexaarylbisimidizole, borate, and a secondary co-initiator such as a photooxidant containing a heterocyclic nitrogen atom substituted with an alkoxy or acyloxy group, which is disclosed in the specification of U.S. Pat. No. 5,942,372; a cyanine dye, a diaryliodonium salt, and a co-initiator having a carboxylic acid group bonded to an N, O or S group bonded directly to an aromatic ring via a methylene group, which are disclosed in the specification of U.S. Pat. No. 5,368,990; a cyanine dye for infrared radiation activity, existing together with trichloromethyltriazine and an organic boron salt, which is disclosed in the specification of U.S. Pat. No. 5,496,903; and an infrared radiation absorbing agent, a compound capable of forming an initiating free radicals, comprising trichloromethyltriazine and an azinium compound, and a co-initiator having a carboxylic acid group bonded to an N, O or S group bonded directly to an aromatic ring via a methylene group, which are disclosed in the specification of U.S. Pat. No. 6,309,792.

In the present invention, as a photopolymerization initiator, a boron salt compound comprising a boron anion represented by the formula (III) shown below:

(III)

wherein $R_1$, $R_2$, $R_3$ and $R_4$ each independently represents an alkyl, aryl, alkenyl, alkynyl, cycloalkyl or heterocyclic group, or two or more of $R_1$, $R_2$, $R_3$ and $R_4$ are combined together to form the heterocyclic ring having a boron atom.

It is possible to suitably use a boron salt compound or an onium salt compound in combination with a neutralized phosphoric acid (meth)acrylate monomer. These ionic initiators had a problem that when used together with a conventional phosphoric acid (meth)acrylate, the ionic form is broken by phosphoric acid with a lapse of time, and thus leading to an unstable lithographic printing plate precursor and short shelf life. These problems are solved by using a neutralized phosphoric acid (meth)acrylate monomer of the present invention. These photopolymerization initiators may be used alone, or two or more kinds of them may be used in combination.

Use of the boron salt compound in combination with an infrared radiation absorbing agent enables exertion of a function as a polymerization initiator. The boron salt compound is suitably an ammonium salt of a quaternary boron anion represented by the formula shown below:

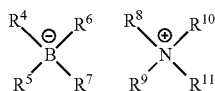

wherein $R^4$, $R^5$, $R^6$ and $R^7$ each independently represents an alkyl group, an aryl group, an alkaryl group, an allyl group, an aralkyl group, an alkenyl group, an alkynyl group, an alicyclic group or a saturated or unsaturated heterocyclic group, and at least one of $R^1$, $R^2$, $R^3$ and $R^4$ is an alkyl group having 1 to 8 carbon atoms. $R^8$, $R^9$, $R^{10}$ and $R^{11}$ each independently represents a hydrogen atom, an alkyl group, an aryl group, an allyl group, an alkaryl group, an aralkyl group, an alkenyl group, an alkynyl group, an alicyclic group or a saturated or unsaturated heterocyclic group.

Among these boron salt compounds, tetra-n-butylammonium triphenylboron, tetra-n-butylammonium trinaphthylboron, tetra-n-butylammonium trip-t-butylphenyl)boron, tetramethylammonium-n-butyltriphenylboron, tetramethylammonium-n-butyltrinaphthylboron, tetramethylammonium-n-octyltriphenylboron, tetramethylammonium-n-octyltrinaphthylboron, tetraethylammonium-n-butyltriphenylboron, tetraethylammonium-n-butyltrinaphthylboron, trimethyl hydrogen ammonium-n-butyltriphenylboron, triethyl hydrogen ammonium-n-butyltriphenylboron, tetrahydrogen ammonium-n-butyltriphenylboron, tetramethylammoniumtetra-n-butylboron, tetraethylammonium tetra-n-butylboron and the like are preferably used since they can efficiently exert a polymerization function.

By using in combination with an infrared radiation absorbing agent, the above boron salt compound can generate a radical by irradiation with infrared radiation thereby to exert a function as a polymerization initiator.

The content of the boron salt compound is preferably within a range from 0.1 to 15% by mass, and particularly preferably from 0.5 to 7% by mass, based on the solid content of the image forming layer. When the content of the boron salt compound is less than 0.1% by mass, the polymerization reaction becomes insufficient and thus the obtained negative-working lithographic printing plate has weak image area because of insufficient curing. When the content of the boron salt compound is more than 15% by mass, the polymerization reaction does not efficiently arise. Two or more kinds of boron salt compounds (B) may be optionally used in combination.

The onium salt compound is a salt composed of a cation having one or more onium ion atoms in the molecule, and an anion. Examples of the onium ion atom in the onium salt include $S^+$ in sulfonium, r in iodonium, $N^+$ in ammonium, $p^+$ atom in phosphonium, $N_2^+$ in diazonium and the like. In particular, examples of preferred onium ion atom include $S^+$, $I^-$, and $N_2^+$. Examples of the structure of the onium salt compound include triphenylsulfonium, diphenyliodonium, diphenyldiazonium, derivatives in which an alkyl group, an aryl group and the like have been introduced into the benzene ring of those compounds, derivatives in which an alkyl group, an aryl group and the like have been introduced into the benzene ring of the compound and the like.

Examples of the anion of the onium salt compound include a halogen anion, $ClO_4^-$, $PF_6^-$, $BF_6^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, a boron anion and the like.

From the viewpoint of sensitivity and storage stability, the onium salt compound is also preferably an onium salt compound in which an onium salt having $S^+$ in the molecule and an onium salt having $I^+$ in the molecule are combined. From the viewpoint of sensitivity and storage stability, the onium salt is also preferably a polyhydric onium salt having two or more onium ion atoms in a molecule. Herein, two or more onium ion atoms in the cation are connected by covalent bonds. Among polyhydric onium salts, a polyhydric onium salt having two or more onium ion atoms in a molecule is preferred, and a polyhydric onium salt having $S^+$ and $I^+$ in a molecule is more preferred.

The content of the onium salt compound is preferably within a range from 0.1 to 15% by mass, and particularly preferably from 0.5 to 7% by mass, based on the solid content of the image forming layer. When the content of the onium salt compound is less than 0.1% by mass, the polymerization reaction may become insufficient, and thus sensitivity and press life of the obtained negative-working lithographic printing plate precursor may become insufficient. When the content of the onium salt compound is more than 15% by mass, developing properties of the obtained negative-working lithographic printing plate precursor deteriorates. Two or more kinds of onium salt compounds may be used in combination. A polyhydric onium salt compound and a monovalent onium salt compound may be used in combination.

To the photopolymerization initiator, optional accelerators, for example, a mercapto compound such as mercapto-3-triazole, an amine compound and the like may be added.

Preferred photoinitiator system comprises an ultraviolet, visible or infrared radiation absorbing agent, an electron acceptor capable of generating initiating free radicals, and a co-initiator capable of donating electrons and/or hydrogen atoms and/or forming initiating free radicals. The amount of the radiation absorbing agent is the amount which enables a photosensitive composition to become insoluble in a wet developing agent, or a fountain solution/printing ink after exposure to radiation. The concentration of the radiation absorbing agent is preferably within a range where molar absorptivity within a range from about 0.05 to 3 mol $l^{-1}$ cm$^{-1}$, preferably from 0.1 to 1.5 mol $l^{-1}$ cm$^-$, and more preferably from 0.3 to 1.0 mol $l^{-1}$ cm$^{-1}$, can be obtained.

<Substrate>

Any substrate can be used as the substrate of the lithographic printing plate precursor of the present invention as long as it has a hydrophilic surface, and a substrate is preferably in the form of a plate which is dimensionally stable, and examples thereof include a paper, a paper laminated with a plastic (for example, polyethylene, polypropylene, polystyrene, etc.), a plate made of aluminum (also including an aluminum alloy), metal such as zinc or copper, or an alloy thereof (for example, an alloy with silicon, copper, manganese, magnesium, chromium, zinc, lead, bismuth, nickel), a plastic film made of cellulose diacetate, cellulose triacetic acid, cellulose propionate, cellulose butyrate, cellulose acetate butyrate, cellulose nitrate, polyethylene terephthalate, polyethylene, polystyrene, polypropylene, polycarbonate, and polyvinyl acetal or the like, a paper or plastic film laminated or deposited with the above-mentioned metal or alloy. Among these substrates, an aluminum plate is particularly preferred since it is remarkably dimensionally stable and is also inexpensive. A composite sheet in which an aluminum sheet is bonded on a polyethylene terephthalate film disclosed in Japanese Examined Patent Publication (Kokoku) No. 48-18327 is also preferred. Usually, the thickness is from about 0.05 mm to 1 mm.

In the case of a substrate having a surface of metal, particularly aluminum, it is preferred to be subjected to the below-mentioned graining treatment, anodizing treatment or surface treatment such as a treatment of immersion in an aqueous solution of sodium silicate, potassium zirconate fluoride, polyvinylphosphonic acid, phosphate and the like.

Examples of the method of the graining treatment include mechanical graining, chemical etching, electrolytic graining and the like disclosed in Japanese Unexamined Patent Publication (Kokai) No. 56-28893. It is also possible to use an electrolytic graining method of electrolytically graining in a hydrochloric acid or nitric acid electrolytic solution; and a mechanical graining method such as a wire brush graining method of scratching an aluminum surface by a metal wire, a ball graining method of graining an aluminum surface by an abrasive ball and an abrasive, or a brush graining method of graining a surface by a nylon brush and an abrasive. These graining methods can be used alone, or used in combination. Among these methods, a method of creating surface roughness, which is usefully used in the present invention, is an electrolytic method of chemically graining in a hydrochloric acid or nitric acid electrolytic solution, and suitable current density is within a range from 100 to 400 $C/dm^2$. More specifically, it is preferred that electrolysis is carried out in an electrolytic solution containing 0.1 to 50% hydrochloric acid or nitric acid under the conditions of a temperature of 20 to 100° C. for 1 second to 30 minutes and a current density of 100 to 400 $C/dm^2$.

The aluminum substrate thus subjected to the graining treatment is chemically etched with an acid or alkali. When the acid is used as an etching agent, it is disadvantageous in the case of industrially applying the present invention since breakage of fine structure requires a long time. However, an improvement can be made by using an alkali as an etching agent.

Examples of the alkali agent, which is suitably used, include caustic soda, sodium carbonate, sodium aluminate, meta sodium silicate, sodium phosphate, potassium hydroxide, lithium hydroxide and the like. The concentration and temperature are preferably within a range of 1 to 50% and a range of 20 to 100° C., respectively, and preferred condition enables the dissolution amount of aluminum to be within a range of 5 to 20 $g/m^3$.

After etching, pickling is carried out so as to remove stains (smuts) remaining on a surface. Examples of usable acid include nitric acid, sulfuric acid, phosphoric acid, chromic acid, hydrofluoric acid, fluoroboric acid and the like. In particular, the method for treatment of removing smuts after an electrolytic roughening treatment is preferably a method of bringing into contact with 15 to 65% by mass sulfuric acid at a temperature of 50 to 90° C., which is disclosed in Japanese Unexamined Patent Publication (Kokai) No. 53-12739, and a method of subjected to alkali etching which is disclosed in Japanese Examined Patent Publication (Kokoku) No. 48-28123. In the present invention, a surface roughness (Ra) of an aluminum substrate is preferably from 0.3 to 0.7 μm.

The aluminum substrate is further subjected to an anodizing treatment. The anodizing treatment can be carried out by a method which has conventionally been carried out in the relevant technical field. Specifically, if a DC or AC voltage is applied to aluminum in an aqueous or non-aqueous solution using sulfuric acid, phosphoric acid, chromic acid, oxalic acid, sulfamic acid, benzenesulfonic acid alone of two or more kinds of them in combination, an anodic oxide film can be formed on an aluminum substrate surface. Since conditions of the anodizing treatment vary depending on an electrolytic solution to be used, the conditions cannot be sweepingly determined. In general, it is appropriate that the concentration of an electrolytic solution is within a range from 1 to 80%, the liquid temperature is within a range from 5 to 70° C., the current density is within a range from 0.5 to 60 ampere/$dm^2$, the voltage is within a range from 1 to 100 V, and the electrolysis time is within a range from 10 to 100 seconds.

Among these anodizing treatments, a method of anodizing in sulfuric acid at high current density, which is disclosed in the specification of British Patent No. 1,412,768, and a method of anodizing using phosphoric acid as an electrolytic bath, which is disclosed in the specification of U.S. Pat. No. 3,511,661 are preferred.

In the present invention, a film weight of an anodic oxide film is preferably from 1 to 10 $g/m^2$. When the film weight is less than 1 $g/m^2$, a plate is likely to be scratched. When the film weight is more than 10 $g/m^2$, a large amount of electric power is required in the production, resulting in economic disadvantage. The film weight is preferably from 1.5 to 7 $g/m^2$, and more preferably from 2 to 5 $g/m^2$.

In the present invention, the substrate may be subjected to a sealing treatment after subjecting to a graining treatment and anodizing. Such a sealing treatment is carried out by immersion of the substrate in hot water or a hot aqueous solution containing an inorganic or organic salt, or a steam bath. The substrate to be used in the present invention may be subject to a surface treatment such as a silicate treatment with an alkali metal silicate, a treatment with potassium zirconate fluoride, or a treatment with an aqueous solution of polyaminesulfonic acid, polyvinylphosphonic acid, polyacrylic acid or polymethacrylic acid.

In the present invention, a coating solution of the above-mentioned image forming layer made of a photosensitive composition is applied on a substrate (in the case of an aluminum plate, an aluminum plate subjected appropriately to a surface treatment as mentioned above is preferred) and also a coating solution of a protective layer is optionally applied, and thus forming a lithographic printing plate precursor. Since the photosensitive composition of the present invention is extremely excellent in adhesion to a substrate, it is not necessary to provide an organic or inorganic undercoat layer between an image forming layer and a substrate. However, the undercoat layer may be optionally provided. It is also possible to apply a sol-gel treatment (although not necessarily) in which a functional group capable of causing an addition reaction by radicals are covalently bonded, which is disclosed in Japanese Unexamined Patent Publication (Kokai) No. 7-159983.

The lithographic printing plate precursor can be developed after directly exposed by second harmonic wave (SHG-LD, 350 to 600 nm) of a semiconductor laser, a YAG-SHG laser, an InGaN-based short wave semiconductor laser and the like. In order to make it possible to handle in a bright room, it is preferred to use a high output laser having maximum intensity from a near infrared radiation range to an infrared radiation range. As such a laser having maximum intensity from a near infrared radiation range to an infrared radiation range, various lasers having maximum intensity in a wavelength range of 760 to 1,200 nm. After imagewise exposure, a heating process at a temperature of 50° C. to 150° C. for 1 second to 5 minutes may be provided for the purpose of increasing a curing rate before development.

It is possible to use, as the developing solution to be used in the developing treatment, conventionally known aqueous alkali solutions. Examples thereof include inorganic alkali agents such as sodium silicate, potassium silicate, sodium triphosphate, potassium triphosphate, ammonium triphosphate, sodium diphosphate, potassium diphosphate, ammonium diphosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide and the like. It is also possible to use in combination with organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like. These alkali agents may be used alone, or two or more kinds of them may be used in combination.

To the developing solution, the below-mentioned surfactants may also be added. Examples of the surfactant of the developing solution include nonionic surfactants, for example, polyoxyethylene alkyl ethers such as polyoxyethylene lauryl ether, polyoxyethylene cetyl ether and polyoxyethylene stearyl ether, polyoxyethylene alkyl allyl ethers such as polyoxyethylene octyl phenyl ether and polyoxyethylene nonyl phenyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan trioleate, and monoglyceride alkyl esters such as glycerol monostearate and glycerol monooleate; anionic surfactants, for example, alkyl benzene sulfonates such as sodium dodecylbenzene sulfonate, alkylnaphthalene sulfonates such as sodium butylnaphthalene sulfonate, sodium pentylnaphthalene sulfonate, sodium hexylnaphthalene sulfonate and sodium octylnaphthalene sulfonate, alkyl sulfates such as sodium lauryl sulfate, alkyl sulfonates such as sodium dodecyl sulfonate, sulfosuccinate ester salts such as sodium dilauryl sulfosuccinate, and alkylbetaines such as laurylbetaine, stearylbetaine; and amphoteric surfactants such as amino acids. Particularly preferred surfactants are anionic surfactants such as alkylnaphthalene sulfonates; alkylbetaines; and nonionic surfactants having a polyoxyalkylene ether group represented by the formula (2):

$$R^1-O-(R^2-O)_nH \quad (2)$$

wherein $R^1$ in the formula (2) represents an alkyl group having 3 to 15 carbon atoms which may have a substituent, an aromatic hydrocarbon group having 6 to 15 carbon atoms which may have a substituent, or a heteroaromatic group having 4 to 15 carbon atoms which may have a substituent (the substituent includes an alkyl group having 1 to 20 carbon atoms, a halogen atom such as Br, Cl or I, an aromatic hydrocarbon group having 6 to 15 carbon atoms, an aralkyl group having 7 to 17 carbon atoms, an alkoxy group having 1 to 20 carbon atoms, an alkoxycarbonyl group having 2 to 20 carbon atoms, and an acyl group having 2 to 15 carbon atoms); $R^2$ represents an alkylene group having 1 to 10 carbon atoms which may have a substituent (the substituent includes an alkyl group having 1 to 20 carbon atoms and an aromatic hydrocarbon group having 6 to 15 carbon atoms); and n represents an integer of 1 to 100. The moiety of $(R^2-O)_n$ of the formula (2) may be two or three kinds of groups as long as it is within the above range. Specific examples thereof include those in which combinations, such as an ethyleneoxy group and a propyleneoxy group, an ethyleneoxy group and an isopropyloxy group, an ethyleneoxy group and a butyleneoxy group, an ethyleneoxy group and an isobutylene group, are connected at random or in a blocked shape.

These surfactants can be used alone, or used in combination. The content of the surfactant in the developing solution is preferably from 0.1 to 20% by mass, in terms of an active ingredient.

In the present invention, it is possible to optionally use, in addition to the above-mentioned components, the below-mentioned components in combination. Examples thereof include organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-2-hydroxyethylbenzoic acid, decanoic acid, salicylic acid and 3-hydroxy-2-naphthoic acid; organic solvents such as isopropyl alcohol, benzyl alcohol, ethyl cellosolve, butyl cellosolve, phenyl cellosolve, propylene glycol and diacetone alcohol; chelating agents; reducing agents; dyes; pigments; water softening agents; antiseptics; and defoamers.

Development of the lithographic printing plate precursor of the present invention with the developing solution is carried out in accordance with a conventional method at a temperature of about 0 to 60° C., and preferably about 15 to 40° C., for example, by immersing the exposed lithographic printing plate precursor in a developing solution and rubbing with a brush. A development treatment may also be carried out using an automatic developing apparatus. In that case, since the developing solution is degraded according to the treating amount, processing power may be recovered using a replenishment liquid or a fresh developing solution. In case a protective layer is provided on an image forming layer, removal of the protective layer and removal of the non-exposed area of the image forming layer may be simultaneously carried out using the above developing solution. Alternatively, the protective layer may be removed with water or warm water first, and then the image forming layer of the non-exposed area may be removed with the developing solution. Water or warm water can contain an antiseptic which is disclosed in Japanese Unexamined Patent Publication (Kokai) No. 10-10754, an organic solvent which is disclosed in Japanese Unexamined Patent Publication (Kokai) No. 8-278636 and the like.

The lithographic printing plate precursor thus developed is preferably subjected to a post treatment using a rinsing solution containing wash water, a surfactant and the like, and a desensitizing liquid containing acasia, a starch derivative and the like, as disclosed in the respective publications such as Japanese Unexamined Patent Publication (Kokai) No. 54-8002, Japanese Unexamined Patent Publication (Kokai) No. 55-115045 and Japanese Unexamined Patent Publication (Kokai) No. 59-58431. In the post treatment of the lithographic printing plate precursor of the present invention, these treatments can be widely used in combination.

Taking account of an environmental problem, development can also be carried out using so-called water having pH in a neutral range. Also in this case, it is possible to add, as a developing solution, the surfactants mentioned in the developing solution for improving developing properties, and the above-mentioned desensitizing liquids for desensitization of a plate surface after the development, to water.

It is possible to improve press life of the lithographic printing plate precursor obtained by the above-mentioned treatments by a heat treatment such as a known post exposure treatment or baking. Next, the lithographic printing plate obtained by the above treatment is mounted to an offset printing press and used for printing so as to obtain a lot of printed sheets.

The obtained lithographic printing plate precursor can also be used as an on-press developing type. The obtained lithographic printing plate precursor can also be used as a plate which is imagewise-exposed and then mounted onto a plate cylinder of a printing press as it is, and thus enabling initiation of printing.

EXAMPLES

The present invention will be described in more detail below in examples shown below, but the present invention is not limited to these examples.

Compounds indicated by abbreviations in examples shown below are as follows.

PGME: Propylene glycol monomethyl ether

MEK: Methyl ethyl ketone

Polymer A: Copolymer of methacrylic acid, allyl methacrylate and methyl methacrylate IR dye A: Cyanine-based infrared radiation absorbing dye shown below

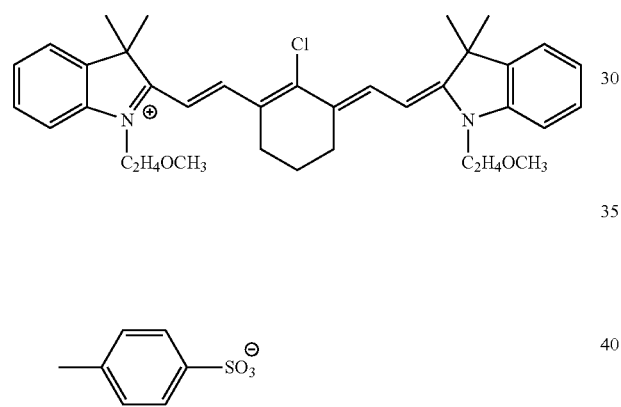

DPHA: Dipentaerythritol hexaacrylate, which is commercially available from NIPPON KAYAKU CO., LTD.

Dye B: Triphenylmethane-based dye shown below

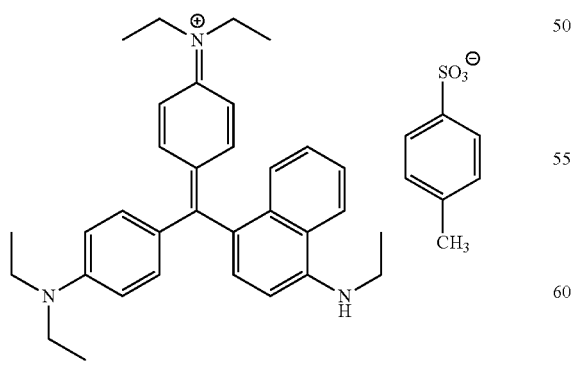

MDP: Hindered phenol type polymerization inhibitor shown below, which is commercially available from Sumitomo Chemical Company, Limited

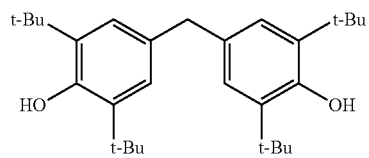 [SMILES: CC(C)(C)c1cc(Cc2cc(C(C)(C)C)c(O)c(C(C)(C)C)c2)cc(C(C)(C)C)c1O]

TAZ-104: Trihalomethyltriazine compound shown below, which is commercially available from Midori Kagaku Co., Ltd.

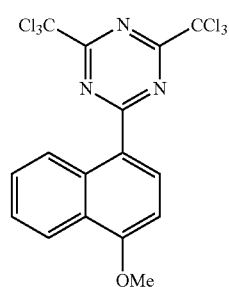

P3B: Boron compound shown below, which is commercially available from Showa Denko K.K.

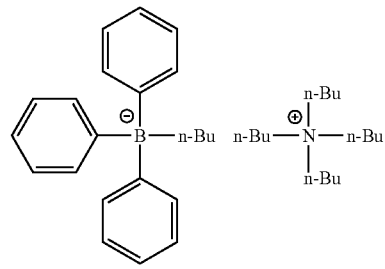

N3B: Boron compound shown below, which is commercially available from Showa Denko K.K.

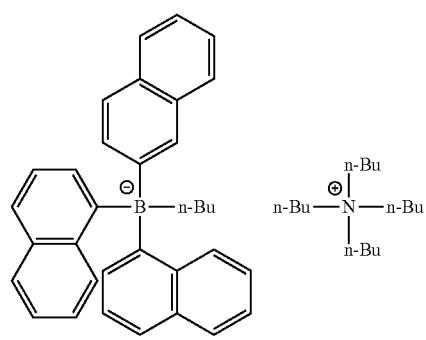

CGI-909: Boron compound shown below, which is commercially available from Ciba Specialty Chemicals Inc.

IR absorbing dye 1 is represented by the formula shown below:

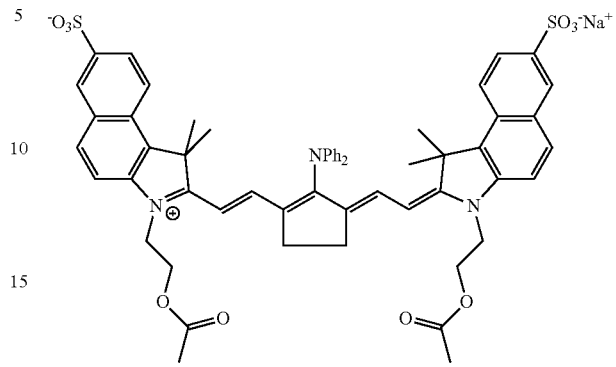

Fluorinated polymer solutions P-1 to P-9 used in Examples are shown below. The proportion in the formula represents mol %.

P-1: 25% methyl isobutyl ketone solution of the polymer shown below

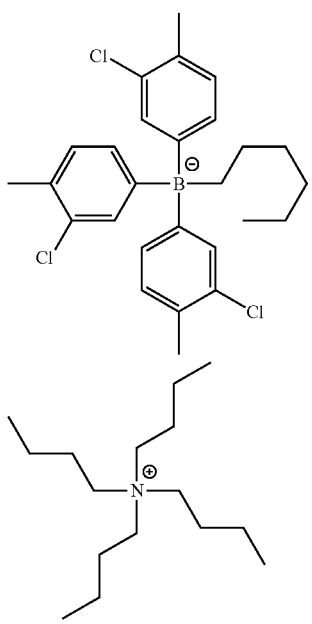 [SMILES: CCCCCC[B-](c1ccc(C)c(Cl)c1)(c1ccc(C)c(Cl)c1)c1ccc(C)c(Cl)c1 ; CCCC[N+](CCCC)(CCCC)CCCC]

Na/TPB: Boron compound having the structure shown below

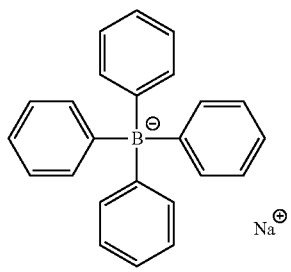 [SMILES: c1ccc([B-](c2ccccc2)(c2ccccc2)c2ccccc2)cc1 ; [Na+]]

Zonyl® FSO: Nonionic fluorine-based surfactant
Zonyl® FSA: Anionic fluorine-based surfactant, which is supplied as an aqueous 25% solution
Initiator A: Boron compound having the structure shown below

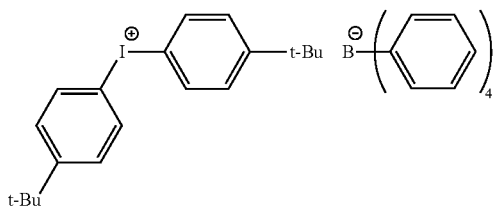

ACA230AA: Alkali-soluble side chain ethylenically unsaturated double bond group-containing acrylic resin, which is commercially available from Daicel Chemical Industries, Ltd. and is supplied as a 53% solution Irgacure 250 is an iodonium salt as a 75% propylene carbonate solution, which is commercially available from Ciba specialty Chemicals, Tarrytown, N.Y. and has the formula: iodonium,(4-methylphenyl)[4-(2-methylpropyl)phenyl], hexafluorophosphate.

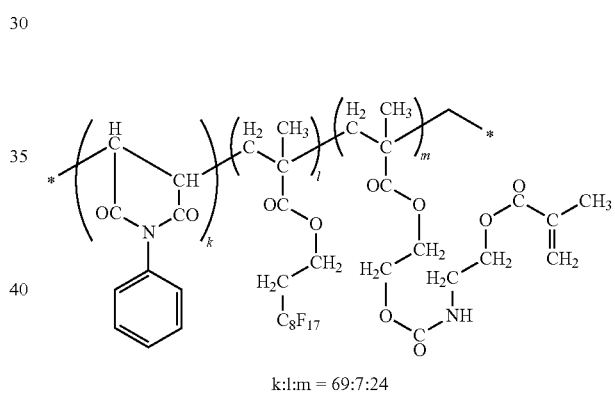

k:l:m = 69:7:24

P-2: 25% methyl isobutyl ketone solution of the polymer shown below

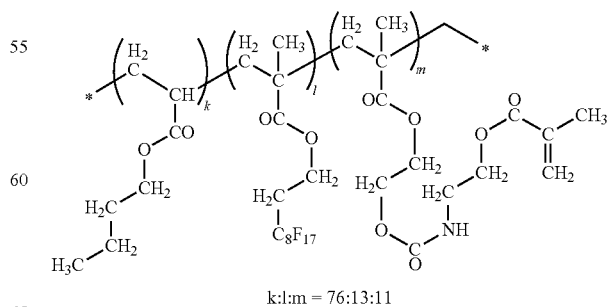

k:l:m = 76:13:11

P-3: 25% methyl isobutyl ketone solution of the polymer shown below
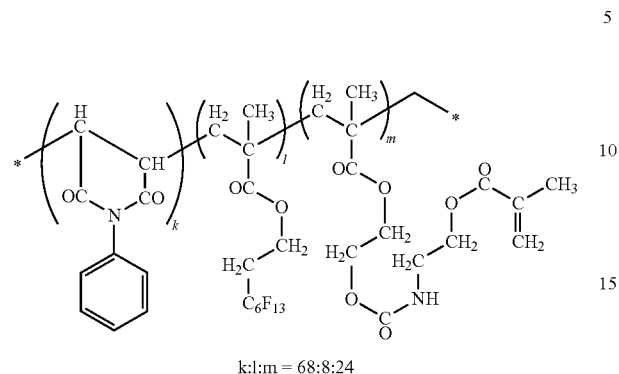
k:l:m = 68:8:24
P-4: 25% methyl isobutyl ketone solution of the polymer shown below
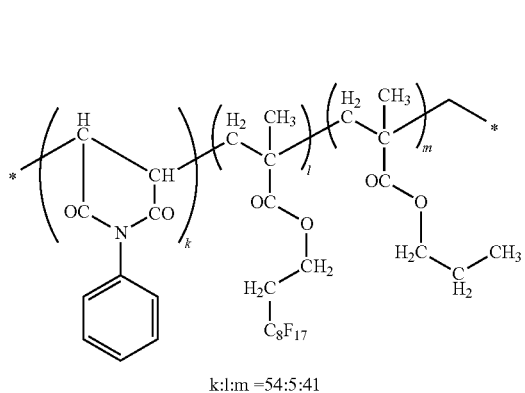
k:l:m = 54:5:41
P-5: 25% methyl isobutyl ketone solution of the polymer shown below
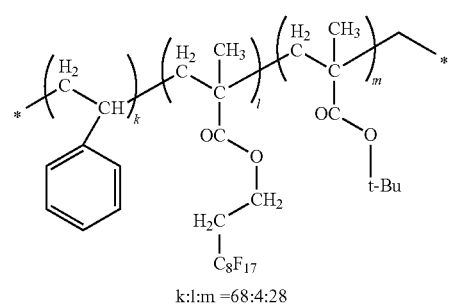
k:l:m = 68:4:28
P-6: 25% methyl isobutyl ketone solution of the polymer shown below
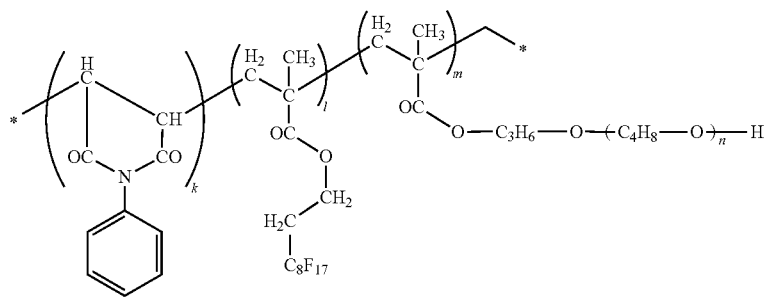
k:l:m = 73:17:10, n = 8
P-7: 25% methyl isobutyl ketone solution of the polymer shown below
k:l:m = 83:10:7, n = 6

P-8: 25% methyl isobutyl ketone solution of the polymer shown below

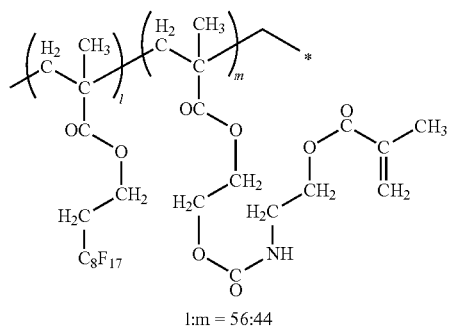

l:m = 56:44

P-9: 25% methyl isobutyl ketone solution of the polymer shown below

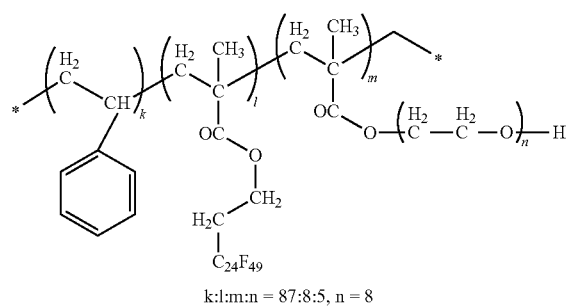

k:l:m:n = 87:8:5, n = 8

Contents of compositions A, B and C, which serve as a base of the radiation-sensitive composition used, are as follows.

Base Composition A

| Components | Addition amount (g) |
|---|---|
| PGME | 30.664 |
| MEK | 59.664 |
| Polymer A | 2.02 |
| ACA 230AA | 3.813 |
| IR dye A | 0.27 |
| DPHA | 2.847 |
| Dye B | 0.264 |
| MDP | 0.075 |

Base Composition B

| Components | Addition amount (g) |
|---|---|
| PGME | 30.664 |
| MEK | 59.664 |
| Polymer A | 2.02 |
| ACA 230AA | 3.813 |
| IR dye A | 0.187 |
| DPHA | 2.847 |
| Dye B | 0.264 |
| MDP | 0.075 |

Base Composition C

| Components | Addition amount (g) |
|---|---|
| Urethane acrylate | 4.95 |
| Graft copolymer 1 | 14.8 |
| Graft copolymer 2 | 1.6 |
| IR absorbing dye 1 | 0.07 |
| n-propanol | 71.71 |
| Water | 18.68 |

Desmodur® N100 (aliphatic polyisocyanate resin comprising hexamethylene diisocyanate as a main component, which is commercially available from Bayer Corp., Milford, Conn.) is reacted with hydroxyethyl acrylate and pentaerythritol triacrylate to prepare urethane acrylate. It is used as a 40% methyl ethyl ketone solution.

A graft copolymer 1 is a polymer grafted with poly(oxy-1,2-ethanediyl), α-(2-methyl-1-oxo-2-propenyl)-ω-methoxy-, ethenylbenzene and combined with components shown in Table 1 as a 25% dispersion of 80% n-propanol/20% water in a solvent. A graft copolymer 2 is a methoxypolyethylene glycol methacrylate-allyl methacrylate graft copolymer and added to components shown in Table 1 as a 10% dispersion in methyl ethyl ketone.

Examples 1 to 4 and Comparative Examples 1 and 2

To a base composition A, a radical initiator, a boron salt compound and a fluorinated polymer P-1 were added (Examples (Inventions) 1 to 4) and a fluorine-based surfactant was used in place of the fluorinated polymer (Comparative Examples 1, 2), and then the respective lithographic printing plate precursors were finally evaluated. Fluorine-based surfactants Zonyl® FSO and Zonyl® FSA are surfactants each having a hydrophilic group.

(1) Production of Substrate

A 0.30 mm thick aluminum plate was degreased with an aqueous sodium hydroxide solution and subjected to an electrolytic graining treatment in a 2% hydrochloric acid bath to obtain a grained plate having a center line average roughness (Ra) of 0.6 μm. Then, this grained plate was subjected to an anodizing treatment in a 20% sulfuric acid bath at a current density of 2 A/dm$^2$ to form an oxide film of 2.7 g/m$^2$, and thus obtaining an aluminum substrate.

(2) Application of Sensitizing Solution

Coating solutions of the respective Examples and Comparative Examples were prepared and each coating solution was applied on the above aluminum substrate using a bar coater, and then dried at 115° C. for 1 minute to obtain a lithographic printing plate precursor. At this time, the amount of a dry coating film was 1.2 g/m$^2$.

TABLE 1

| | Radical initiator (g) | Boron compound (g) | | | | Fluorinated polymer (g) | Fluorine-based surfactant (g) | |
|---|---|---|---|---|---|---|---|---|
| | TAZ-104 | P3B | N3B | CGI-909 | Na/TPB | P-1 | Zonyl FSO | Zonyl FSA |
| Example 1 | 0.155 | 0.096 | | | | 0.132 | | |
| Example 2 | 0.155 | | 0.122 | | | 0.132 | | |
| Example 3 | 0.155 | | | 0.126 | | 0.132 | | |
| Example 4 | 0.155 | | | | | 0.132 | | |
| Comparative Example 1 | 0.155 | 0.096 | | | | | | 0.132 |
| Comparative Example 2 | 0.155 | | | | 0.096 | | 0.033 | |

Evaluation Test

The lithographic printing plate precursor thus produced was tested with respect to developing properties, sensitivity, press life and blooming. Test procedures are as follows.

<Developing Properties>

In an automatic developing apparatus PK1310news manufactured by Kodak Japan Ltd., 9.3 L of a concentration type developing solution manufactured by Kodak Japan Ltd. and 32.7 L of tap water were charged, and the development temperature was set to 30° C. Water was charged in a rinse tank, and an NF-3 gum solution (diluted 1+1) was charged in a gum tank. Using the lithographic printing plate precursor thus obtained, the number of seconds of development (retention time of a lithographic printing plate precursor in a developing solution) was widely varied and the minimum time required to complete the development was indicated by the number of seconds as developing properties.

<Sensitivity>

The lithographic printing plate precursor thus produced was exposed by widely varying an exposure energy dose using an exposure apparatus Magnus 800 plate setter manufactured by Kodak Japan Ltd. In an automatic developing apparatus PK1310news manufactured by Kodak Japan Ltd., 9.3 L of a concentration type developing solution manufactured by Kodak Japan Ltd. and 32.7 L of tap water were charged, and the development temperature was set to 30° C. and the number of seconds of development was set to 12 seconds. Tap water was charged in a rinse tank, and an NF-3 gum solution (diluted 1+1) was charged in a gum tank. The exposed obtained lithographic printing plate precursor was subjected to a development treatment using an automatic developing apparatus, and minimum exposure dose required to obtain images was indicated by $mJ/cm^2$ as sensitivity.

<Press Life>

The lithographic printing plate precursor thus produced was exposed at an exposure energy dose 120 $mJ/cm^2$ using an exposure apparatus Magnus 800 plate setter manufactured by Kodak Japan Ltd. In an automatic developing apparatus PK1310news manufactured by Kodak Japan Ltd., 9.3 L of a concentration type developing solution manufactured by Kodak Japan Ltd. and 32.7 L of tap water were charged, and the development temperature was set to 30° C. and the number of seconds of development was set to 12 seconds. Tap water was charged in a rinse tank, and an NF-3 gum solution (diluted 1+1) was charged in a gum tank. The exposed lithographic printing plate precursor was subjected to a development treatment using an automatic developing apparatus, and printing was carried out by a lithographic printing press S-26 manufactured by KOMORI Corporation. Maximum number of printed sheets required to obtain clear images was indicated by the number of sheets as press life.

<Blooming>

The lithographic printing plate precursor thus produced was left to stand under the conditions of 40° C. and 80% RH for 7 days. The lithographic printing plate precursor left to stand was observed in detail, and the degree of crystallization was evaluated with respect to the lithographic printing plate precursor in which crystallization of a photosensitive composition component occurs on a surface of an image forming layer, namely, blooming occurs.

A: Crystallization of a photosensitive composition component did not occurred on a surface of an image forming layer.

B: Although crystallization of a photosensitive composition component occurred on a surface of an image forming layer, void of the image forming layer did not occur due to poor curing during exposure and development, and thus resulting in such an extent as not to be practically out of the question.

C: Crystallization of a photosensitive composition component occurred on a surface of an image forming layer, and void of the image forming layer occurred due to poor curing during exposure and development, and thus resulting in such an extent as to be practically out of the question.

TABLE 2

| | Developing properties | Sensitivity | Press life | Blooming |
|---|---|---|---|---|
| Example 1 | 12 sec | 50.8 $mJ/cm^2$ | 20,000 | A |
| Example 2 | 12 sec | 49.1 $mJ/cm^2$ | 20,000 | A |
| Example 3 | 13 sec | 52.5 $mJ/cm^2$ | 20,000 | A |
| Example 4 | 12 sec | No sensitivity | | A |
| Comparative Example 1 | 13 sec | 50.8 $mJ/cm^2$ | 20,000 | C |
| Comparative Example 2 | 12 sec | No sensitivity | | C |

Examples 5 to 9 and Comparative Examples 3 and 4

To a base composition B, a radical initiator, a boron salt compound and a fluorinated polymer P-1 were added (Examples (Inventions) 6 to 9), and a fluorine-based surfactant was used in place of the fluorinated polymer (Comparative Examples 3, 4), and then the respective lithographic printing plate precursors were finally evaluated. A fluorine-based surfactant Zonyl® FSO is a surfactant having a hydrophilic group.

TABLE 3

| | Radical initiator (g) | | Boron salt compound (g) | | | Fluorinated polymer (g) | Fluorine-based surfactant (g) |
|---|---|---|---|---|---|---|---|
| | Irgacure 250 | Initiator A | P3B | CGI-909 | Na/TPB | p-1 | Zonyl FSO |
| Example 5 | | 0.536 | 0.038 | | | 0.132 | |
| Example 6 | | 0.536 | | 0.05 | | 0.132 | |
| Example 7 | 0.737 | | 0.038 | | 0.381 | 0.132 | |
| Example 8 | 0.737 | | | | 0.381 | 0.132 | |
| Example 9 | 0.737 | | 0.038 | | | 0.132 | |
| Comparative Example 3 | | 0.536 | | | | | 0.033 |
| Comparative Example 4 | | 0.536 | 0.038 | | | | 0.033 |

TABLE 4

| | Developing properties | Sensitivity | Press life | Blooming |
|---|---|---|---|---|
| Example 5 | 12 sec | 51.3 mJ/cm$^2$ | 20,000 | A |
| Example 6 | 12 sec | 52.6 mJ/cm$^2$ | 20,000 | A |
| Example 7 | 12 sec | 54.3 mJ/cm$^2$ | 18,000 | A |
| Example 8 | 12 sec | 60.3 mJ/cm$^2$ | 16,000 | A |
| Example 9 | 12 sec | 53.6 mJ/cm$^2$ | 14,000 | A |
| Comparative Example 3 | 13 sec | 64.4 mJ/cm$^2$ | 12,000 | C |
| Comparative Example 4 | 12 sec | 51.3 mJ/cm$^2$ | 20,000 | C |

Examples 10 to 17 and Comparative Examples 5 to 7

To a base composition A, a radical initiator, a boron salt compound and fluorinated polymers P-1 to P-9 were respectively added (Examples (Inventions) 10 to 17, Comparative Example 5 to 7), and then the respective lithographic printing plate precursors were finally evaluated. Comparative Examples 5 and 6 are examples using a fluorinated polymer which has a hydrophilic group in the molecule and has a function as a surfactant.

TABLE 5

| | Radical initiator (g) | Boron salt compound (g) | Fluorinated polymer (g) | | | | | | | |
|---|---|---|---|---|---|---|---|---|---|---|
| | TAZ-104 | P3B | P-2 | P-3 | P-4 | P-5 | P-6 | P-7 | P-8 | P-9 |
| Example 10 | 0.155 | 0.096 | 0.132 | | | | | | | |
| Example 11 | 0.155 | 0.096 | | 0.132 | | | | | | |
| Example 12 | 0.155 | 0.096 | | | 0.132 | | | | | |
| Example 13 | 0.155 | 0.096 | | | | 0.132 | | | | |
| Example 14 | 0.155 | 0.096 | | | | | | 0.132 | | |
| Example 15 | 0.155 | 0.096 | | | | | | | 0.132 | |
| Example 16 | 0.155 | 0.096 | | 0.452 | | | | | | |
| Example 17 | 0.155 | 0.096 | | 0.066 | | | 0.066 | | | |
| Comparative Example 5 | 0.155 | 0.096 | | | | 0.132 | | | | |
| Comparative Example 6 | 0.155 | 0.096 | | | | | | | | 0.132 |
| Comparative Example 7 | 0.155 | 0.096 | | | | | | | | |

TABLE 6

| | Developing properties | Sensitivity | Press life | Blooming |
|---|---|---|---|---|
| Example 10 | 12 sec | 50.8 mJ/cm$^2$ | 20,000 | A |
| Example 11 | 12 sec | 51.3 mJ/cm$^2$ | 20,000 | A |
| Example 12 | 12 sec | 52.6 mJ/cm$^2$ | 18,000 | A |
| Example 13 | 12 sec | 52.6 mJ/cm$^2$ | 18,000 | A |
| Example 14 | 12 sec | 51.3 mJ/cm$^2$ | 20,000 | A, B |
| Example 15 | 12 sec | 50.8 mJ/cm$^2$ | 18,000 | A |
| Example 16 | 12 sec | 50.8 mJ/cm$^2$ | 12,000 | A |
| Example 17 | 13 sec | 50.8 mJ/cm$^2$ | 18,000 | A, B |
| Comparative Example 5 | 12 sec | 50.8 mJ/cm$^2$ | 20,000 | C |
| Comparative Example 6 | 12 sec | 50.8 mJ/cm$^2$ | 10,000 | C |
| Comparative Example 7 | 16 sec | 50.8 mJ/cm$^2$ | 20,000 | B |

Example 18 to 23 and Comparative Example 8 to 10

To a base composition B, a radical initiator, a boron salt compound and fluorinated polymers P-1 to P-9 were respectively added (Examples (Inventions) 18 to 23, Comparative Example 8 to 10), and then the respective lithographic printing plate precursors were finally evaluated. Comparative Examples 8 and 9 are examples using P-6 and P-9 each having a hydrophilic group in the molecule and having a function as a surfactant.

TABLE 7

| | Radical initiator (g) | Boron salt compound (g) | Fluorinated polymer (g) | | | | | | | |
|---|---|---|---|---|---|---|---|---|---|---|
| | Initiator A | P3B | P-2 | P-3 | P-4 | P-5 | P-6 | P-7 | P-8 | P-9 |
| Example 18 | 0.536 | 0.038 | 0.132 | | | | | | | |
| Example 19 | 0.536 | 0.038 | | 0.132 | | | | | | |
| Example 20 | 0.536 | 0.038 | | | 0.132 | | | | | |
| Example 21 | 0.536 | 0.038 | | | | 0.132 | | | | |
| Example 22 | 0.536 | 0.038 | | 0.226 | | | | | | |
| Example 23 | 0.536 | 0.038 | | | | | | | 0.132 | |
| Comparative Example 8 | 0.536 | 0.038 | | | | | 0.132 | | | |
| Comparative Example 9 | 0.536 | 0.038 | | | | | | | | 0.132 |
| Comparative Example 10 | 0.536 | 0.038 | | | | | | | | |

TABLE 8

| | Developing properties | Sensitivity | Press life | Blooming |
|---|---|---|---|---|
| Example 18 | 12 sec | 51.3 mJ/cm$^2$ | 20,000 | A |
| Example 19 | 12 sec | 52.5 mJ/cm$^2$ | 20,000 | A |
| Example 20 | 12 sec | 51.3 mJ/cm$^2$ | 18,000 | A |
| Example 21 | 12 sec | 51.3 mJ/cm$^2$ | 18,000 | A |
| Example 22 | 12 sec | 51.3 mJ/cm$^2$ | 16,000 | A |
| Example 23 | 12 sec | 51.3 mJ/cm$^2$ | 20,000 | A |
| Comparative Example 8 | 12 sec | 51.3 mJ/cm$^2$ | 20,000 | C |
| Comparative Example 9 | 12 sec | 51.3 mJ/cm$^2$ | 12,000 | C |
| Comparative Example 10 | 17 sec | 51.3 mJ/cm$^2$ | 20,000 | B |

<On-press Developing Type Lithographic Printing Plate>
(1) Production of Substrate A 0.30 mm thick aluminum plate was degreased with an aqueous sodium hydroxide solution and subjected to an electrolytic graining treatment in a 2% hydrochloric acid bath to obtain a grained plate having a center line average roughness (Ra) of 0.6 μm. Then, this grained plate was subjected to an anodizing treatment in a 20% sulfuric acid bath at a current density of 2 A/dm$^2$ to form an oxide film of 2.7 g/m$^2$. Then, the aluminum plate was immersed in an aqueous 1% polyvinylphosphonic acid solution maintained at 60° C. for 20 seconds, washed with water and then dried to obtain an aluminum substrate.

(2) Application of Sensitizing Solution

Coating solutions of the respective Examples and Comparative Examples were prepared and each coating solution was applied on the above aluminum substrate using a bar coater, and then dried at 115° C. for 1 minute to obtain a lithographic printing plate precursor. At this time, the amount of a dry coating film was 1.2 g/m$^2$.

<Sensitivity>

The lithographic printing plate precursor thus produced was exposed by widely varying an exposure energy dose using an exposure apparatus Magnus 800 plate setter manufactured by Kodak Japan Ltd. In an automatic developing apparatus PK1310news manufactured by Kodak Japan Ltd., 9.3 L of a concentration type developing solution manufactured by Kodak Japan Ltd. and 32.7 L of water were charged, and the development temperature was set to 30° C. and the number of seconds of development was set to 12 seconds. Tap water was charged in a rinse tank, and an NF-3 gum solution (diluted 1+1 with tap water) was charged in a gum tank. The exposed obtained lithographic printing plate precursor was subjected to a development treatment using an automatic developing apparatus, and minimum exposure dose required to obtain images was indicated by mJ/cm$^2$ as sensitivity.

Example 24 and Comparative Example 11

To a base composition C, a radical initiator, a boron salt compound and a fluorinated polymer P-1 were respectively added (Example (Invention) 24), and a fluorine-based surfactant Zonyl® FSA was used in place of the fluorinated polymer (Comparative Example 11), and on-press development was carried out and then the respective lithographic printing plate precursors were finally evaluated.

According to an on-press developing method, the exposed lithographic printing plate precursor was mounted to a printing press and the printing press was rotated 10 times in a state where a water roller is lowered thereby to supply a fountain solution on a plate surface, and then the printing press was rotated 10 times in a state where an ink roller is lowered thereby to remove the image forming layer of the non-exposed area on the plate surface, and thus completing on-press development. The lithographic printing plate precursor in which on-press development was completed by the above method and thus the image forming layer of the non-exposed area could be removed was rated as "satisfactory on-press development", whereas, the lithographic printing plate precursor in which on-press development was not completed by the above method and thus requiring that the number of rotations of the ink roller is increased to more than 10 rotations was rated as "poor on-press development".

<Sensitivity>

The lithographic printing plate precursor thus produced was exposed by widely varying an exposure energy dose using an exposure apparatus Magnus 800 plate setter manufactured by Kodak Japan Ltd. The plate was mounted to a printing press Roland 200 manufactured by Manroland AG and then an on-press development treatment was carried out. After the on-press development, a printing paper was fed and printing was initiated, and minimum exposure dose required to obtain images was indicated by mJ/cm$^2$ as sensitivity.

<Blooming>

The lithographic printing plate precursor thus produced was left to stand under the conditions of 40° C. and 80% RH for 7 days. The lithographic printing plate precursor left to stand was observed in detail, and the degree of crystallization was evaluated with respect to the lithographic printing plate precursor in which crystallization of a photosensitive composition component occurs on a surface of an image forming layer, namely, blooming occurs.

A: Crystallization of a photosensitive composition component did not occurred on a surface of an image forming layer.
B: Although crystallization of a photosensitive composition component occurred on a surface of an image forming layer, void of the image forming layer did not occur due to poor curing during exposure and development, and thus resulting in such an extent as not to be practically out of the question.
C: Crystallization of a photosensitive composition component occurred on a surface of an image forming layer, and void of the image forming layer occurred due to poor curing during exposure and development, and thus resulting in such an extent as to be practically out of the question.

TABLE 9

|  | Radical initiator (g) TAZ-104 | Boron salt compound (g) P3B | Fluorinated polymer (g) P-1 | Fluorine-based surfactant (g) Zonyl FSA |
|---|---|---|---|---|
| Example 24 | 0.155 | 0.096 | 0.132 |  |
| Comparative Example 11 | 0.155 | 0.096 |  | 0.132 |

TABLE 10

|  | On-press developing properties | Sensitivity | Blooming |
|---|---|---|---|
| Example 24 | Satisfactory | 124 mJ/cm² | A |
| Comparative Example 11 | Satisfactory | 130 mJ/cm² | C |

Example 25 and Comparative Example 12

To a base composition C, a radical initiator, a boron salt compound and a fluorinated polymer P-1 were respectively added (Example (Invention) 25), and a fluorine-based surfactant Zonyl® FSO was used in place of the fluorinated polymer (Comparative Example 12), and on-press development was carried out and then the respective lithographic printing plate precursors were finally evaluated.

TABLE 11

|  | Radical initiator (g) | | Boron salt compound (g) P3B | Fluorinated polymer (g) P-1 | Fluorine-based surfactant (g) Zonyl FSO |
|---|---|---|---|---|---|
|  | Irgacure 250 | Initiator A | | | |
| Example 25 |  | 0.536 | 0.038 | 0.132 |  |
| Comparative Example 12 |  | 0.536 | 0.038 |  | 0.033 |

TABLE 12

|  | On-press developing properties | Sensitivity | Blooming |
|---|---|---|---|
| Example 25 | Satisfactory | 120 mJ/cm² | A |
| Comparative Example 12 | Satisfactory | 126 mJ/cm² | C |

Time-Dependent Change Acceleration Test

The lithographic printing plate precursor thus produced was left to stand under heating conditions at 50° C. for 7 days, and then a decrease in sensitivity from exposure sensitivity possessed by a lithographic printing plate precursor, which is not left to stand under heating conditions, was evaluated. The lithographic printing plate precursor was exposed by widely varying an exposure energy dose using an exposure apparatus Magnus 800 plate setter manufactured by Kodak Japan Ltd. In an automatic developing apparatus PK1310news manufactured by Kodak Japan Ltd., 9.3 L of a concentration type developing solution manufactured by Kodak Japan Ltd. and 32.7 L of tap water were charged, and the development temperature was set to 30° C. and the number of seconds of development was set to 12 seconds. Water was charged in a rinse tank, and an NF-3 gum solution (diluted 1+1) was charged in a gum tank. The exposed obtained lithographic printing plate precursor was subjected to a development treatment using an automatic developing apparatus, and minimum exposure dose required to obtain images was indicated by mJ/cm² as sensitivity.

TABLE 13

|  | 0 day | 7 days |
|---|---|---|
| Example 5 | 51.3 mJ/cm² | 54.7 mJ/cm² |
| Example 6 | 52.6 mJ/cm² | 53.1 mJ/cm² |

The invention claimed is:

1. A lithographic printing plate precursor comprising a substrate having thereon an image forming layer comprising a radiation-sensitive composition which comprises a radical polymerizable component, an infrared radiation absorbing agent and a radical polymerization initiator, wherein the radiation-sensitive composition comprises a fluorinated copolymer having no hydrophilic moiety selected from cationic, anionic, acidic and polyoxyethylene groups.

2. The lithographic printing plate precursor according to claim 1, wherein the fluorinated copolymer is represented by the following Formula (A) and comprises at least two monomer units represented by the following formulas (I) and (II):

Formula (A):

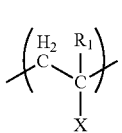

(I)

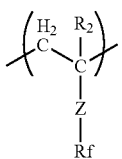

(II)

wherein
R$_1$ and R$_2$ are hydrogens or methyl groups,
Rf represents an aliphatic group substituted with a fluorine atom,
Z represents a divalent organic group, and
X represents an optional organic group which does not contain a hydrophilic moiety selected from a cationic group, an anionic group, an acidic group and polyoxyethylene group.

3. The lithographic printing plate precursor according to claim 2, wherein the fluorinated copolymer comprises 10 to 97 mol % of a monomer unit of the formula (I) and 3 to 90 mol % of a monomer unit of the formula (II).

4. The lithographic printing plate precursor according to claim 2, wherein Rf of the formula (A) is an aliphatic group having 1 to 20 carbon atoms in which at least two hydrogen atoms of the terminal carbon are substituted with a fluorine atom.

5. The lithographic printing plate precursor according to claim 2, wherein X of the formula (A) represents a —CO-A-Y group, A represents an oxygen atom or NR$^4$—, in which R$^4$ represents a hydrogen atom or a monovalent hydrocarbon group having 1 to 10 carbon atoms, and Y is selected from the group consisting of an alkyl group which may have a substituent, an aryl group which may have a substituent, and a monovalent organic group having an unsaturated group.

6. The lithographic printing plate precursor according to claim 1, wherein the fluorinated copolymer having no hydrophilic moiety selected from cationic, anionic, acidic and polyoxyethylene groups further comprises a monomer unit having a maleimide structure represented by the following formula (1):

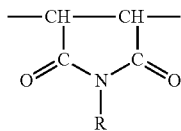

wherein R represents a hydrogen atom or a hydrocarbon group selected from the group consisting of an alkyl group, an alkenyl group and an aryl group.

7. The lithographic printing plate precursor according to claim 1, wherein the radical polymerization initiator is selected from the group consisting of a sulfonium salt, an iodonium salt, a diazonium salt, and a triazine compound comprising a halomethyl moiety.

8. The lithographic printing plate precursor according to claim 1, wherein the radiation-sensitive composition further comprises at least one boron salt compound comprising a boron anion represented by the formula (III):

wherein R$_1$, R$_2$, R$_3$ and R$_4$ each independently represents an alkyl, aryl, alkenyl, alkynyl, cycloalkyl or heterocyclic group, or two or more of R$_1$, R$_2$, R$_3$ and R$_4$ are combined together to form a heterocyclic ring having the boron atom.

9. The lithographic printing plate precursor according to claim 1, wherein the radiation-sensitive composition further comprises a binder resin.

10. The lithographic printing plate precursor according to claim 1, wherein the image forming layer can be developed with an aqueous alkali solution.

11. The lithographic printing plate precursor according to claim 1, wherein the image forming layer can be developed with a fountain solution or a printing ink, or both a fountain solution and a printing ink.

12. A method for providing a lithographic printing plate, comprising:
imagewise exposing the lithographic printing plate precursor of claim 1 to provide an exposed precursor, and
developing the exposed precursor to provide a lithographic printing plate.

* * * * *